(12) United States Patent
Kim

(10) Patent No.: US 9,252,393 B2
(45) Date of Patent: Feb. 2, 2016

(54) FLEXIBLE DISPLAY APPARATUS INCLUDING A THIN-FILM ENCAPSULATING LAYER AND A MANUFACTURING METHOD THEREOF

(71) Applicant: SAMSUNG DISPLAY CO., LTD., Yongin, Gyeonggi-Do (KR)

(72) Inventor: Jae-Hyun Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/246,494

(22) Filed: Apr. 7, 2014

(65) Prior Publication Data

US 2015/0137131 A1 May 21, 2015

(30) Foreign Application Priority Data

Nov. 15, 2013 (KR) .................. 10-2013-0139326

(51) Int. Cl.
- H01L 51/52 (2006.01)
- H01L 51/56 (2006.01)
- H01L 51/00 (2006.01)
- H01L 27/32 (2006.01)

(52) U.S. Cl.
CPC ........ *H01L 51/5256* (2013.01); *H01L 27/3244* (2013.01); *H01L 51/0097* (2013.01); *H01L 51/56* (2013.01)

(58) Field of Classification Search
None
See application file for complete search history.

(56) References Cited

U.S. PATENT DOCUMENTS

| 5,508,067 | A | 4/1996 | Sato et al. | |
|---|---|---|---|---|
| 2004/0253451 | A1* | 12/2004 | Kawashima et al. | 428/411.1 |
| 2013/0059155 | A1 | 3/2013 | Choi et al. | |
| 2014/0048780 | A1* | 2/2014 | Song et al. | 257/40 |
| 2014/0246664 | A1* | 9/2014 | Shoda | 257/40 |

FOREIGN PATENT DOCUMENTS

| JP | 7-106256 | 4/1995 |
|---|---|---|
| JP | 7-161689 | 6/1995 |
| JP | 2004-356595 A | 12/2004 |
| JP | 2008-100398 A | 5/2008 |

OTHER PUBLICATIONS

Definition of interface. (n.d.) American Heritage® Dictionary of the English Language, Fifth Edition. (2011). Retrieved Apr. 26, 2015 from http://www.thefreedictionary.com/interface.*
Ohring, Milton, et al. *Mechanical Properties of Thin Films*, The Materials Science of Thin Film, Academic Press, Boston, (1992), pp. 414-415.

(Continued)

*Primary Examiner* — Michael Jung
(74) *Attorney, Agent, or Firm* — Christie, Parker & Hale, LLP

(57) ABSTRACT

A flexible display apparatus includes: a flexible substrate; a display unit on the flexible substrate; and a thin-film encapsulating layer on the display unit. The thin-film encapsulating layer includes at least one organic layer and at least one inorganic layer. The inorganic layer comprises carbon having a concentration gradient distributed at an interface between the at least one organic layer and the at least one inorganic layer. A manufacturing method of the flexible display apparatus is also disclosed.

16 Claims, 7 Drawing Sheets

(56) References Cited

OTHER PUBLICATIONS

Freund, L.B., et al. *Film Buckling, Bulging and Peeling*, Thin Film Materials: Stress, Defect Formation and Surface Evolution Jan. 19, 2009, pp. 314-315.

Kim, Gihyun, et al. *Plastic Substrates for Flexible Display*, Electronics and Communications Trends vol. 23, No. 5, Oct. 2008, pp. 118-119, with English translation (5 pages).

* cited by examiner

FLEXIBLE DISPLAY APPARATUS INCLUDING A THIN-FILM ENCAPSULATING LAYER AND A MANUFACTURING METHOD THEREOF

CROSS-REFERENCE TO RELATED APPLICATION

This application claims priority to and the benefit of Korean Patent Application No. 10-2013-0139326, filed on Nov. 15, 2013, in the Korean Intellectual Property Office, the disclosure of which is incorporated herein in its entirety by reference.

BACKGROUND

1. Field

One or more aspects of embodiments of the present invention relate to a flexible display apparatus and a manufacturing method thereof.

2. Description of the Related Art

Typically, an organic light-emitting display apparatus having a thin-film transistor may be used in displays for mobile devices, such as smart phones, digital cameras, camcorders, portable information terminals, super slim laptop computers, tablet personal computers, and the like, and electronic and electrical products, such as super slim TVs.

The organic light-emitting display apparatus usually includes an organic light-emitting device having a first electrode, a second electrode, and an intermediate layer between the first electrode and the second electrode. The organic light-emitting display apparatus has wide viewing angles, high contrast, and quick response.

Recent research has been aimed at manufacturing a slimmer display apparatus. A flexible display apparatus that is easy to carry and may be applied to devices of various shapes has attracted attention as a next-generation display apparatus. In particular, a flexible display apparatus utilizing an organic light-emitting display has been considered.

The flexible display apparatus utilizing an organic light-emitting device usually includes a thin-film encapsulating layer to cover an organic light-emitting device. In the thin-film encapsulating layer, the thickness of an inorganic layer is increased and thus, the thin-film encapsulating layer exhibits good barrier characteristics. However, increased thickness of the inorganic layer also increases stress, thereby resulting in delamination. Furthermore, when the flexible display apparatus is bent, stress is focused at an interface between an organic layer and an inorganic layer, resulting in cracking and peeling.

SUMMARY

One or more embodiments of the present invention are directed toward a flexible display apparatus in which crack generation and delamination is reduced by distributing carbon having a concentration gradient at an interface between an organic layer and an inorganic layer which constitute a thin-film encapsulating layer, and a manufacturing method thereof.

Additional aspects will be set forth in part in the description which follows and, in part, will be apparent from the description, or may be learned by practice of the presented embodiments.

According to one or more embodiments of the present invention, a flexible display apparatus includes a flexible substrate; a display unit on the flexible substrate; and a thin-film encapsulating layer on the display unit and including at least one organic layer and at least one inorganic layer, between which an interface is defined, the interface including carbon having a concentration gradient.

The concentration by weight of carbon may gradually decrease from the at least one organic layer to the at least one inorganic layer.

The concentration gradient may gradually decrease from about 70% by weight of carbon in the at least one organic layer to about 15% by weight of carbon in the at least one inorganic layer.

A gradient of a Young's modulus may be inversely proportional to the concentration gradient of the carbon.

The concentration gradient of the carbon may be formed by a chemical vapor deposition process.

The at least one inorganic layer may be formed by applying a hydrocarbon gas to a plurality of reaction gases for forming the at least one inorganic layer and gradually changing a flow rate of the hydrocarbon gas.

The at least one inorganic layer may include a silicon oxynitride ($SiO_xN_y$) layer, a plurality of reaction gases for forming the $SiO_xN_y$ layer may include silane ($SiH_4$), nitrogen oxide ($N_2O$), and at least one of ammonia ($NH_3$) and nitrogen gas ($N_2$), the hydrocarbon gas may include methane ($CH_4$), and the carbon having a concentration gradient may be distributed at the interface between the at least one organic layer and the at least one inorganic layer by gradually changing the flow rate of the hydrocarbon gas.

The at least one inorganic layer may include a silicon oxide ($SiO_x$) layer, a plurality of reaction gases for forming the $SiO_x$ layer may include $SiH_4$ and $N_2O$, the hydrocarbon gas may include $CH_4$, and the carbon having a concentration gradient may be distributed at the interface between the at least one organic layer and the at least one inorganic layer by gradually changing the flow rate of the hydrocarbon gas.

The at least one inorganic layer may include a silicon nitride ($SiN_x$) layer, a plurality of reaction gases for forming the $SiN_x$ layer may include $SiH_4$ and at least one of $NH_3$ and $N_2$, the hydrocarbon gas may include $CH_4$, and the carbon having a concentration gradient may be distributed at the interface between the at least one organic layer and the at least one inorganic layer by gradually changing the flow rate of the hydrocarbon gas.

The at least one inorganic layer may include a composite layer of $SiO_x/SiN_x$ or $SiN_x/SiO_x$, a plurality of reaction gases for forming the composite layer of $SiO_x/SiN_x$ or $SiN_x/SiO_x$ may include $SiH_4$, $N_2O$, and at least one of $NH_3$ and $N_2$, the hydrocarbon gas may include $CH_4$, and the carbon having a concentration gradient may be distributed at the interface between the at least one organic layer and the at least one inorganic layer by gradually changing the flow rate of the hydrocarbon gas.

According to one or more embodiments of the present invention, a method of manufacturing a flexible display apparatus includes positioning a display unit on a substrate and positioning the substrate and the display unit inside a vacuum chamber; applying a thin-film encapsulating layer on the display unit by evaporation, where the thin-film encapsulating layer includes at least one organic layer and at least one inorganic layer, injecting a plurality of reaction gases into the vacuum chamber while forming the at least one inorganic layer, and evaporating the plurality of reaction gases such that an interface between the at least one organic layer and the at least one inorganic layer includes carbon having a concentration gradient.

The concentration by weight of the carbon may gradually decrease from the at least one organic layer to the at least one inorganic layer.

The concentration gradient of the carbon between the at least one organic layer and the at least one inorganic layer may gradually decrease from about 70% by weight of carbon in the at least one organic layer to about 15% by weight of carbon in the at least one inorganic layer.

The at least one inorganic layer may include at least one selected from $SiO_xN_y$, $SiO_x$, $SiN_x$, aluminum oxide ($AlO_x$), or silicon carbide ($SiC_x$).

The at least one inorganic layer may be formed by applying a hydrocarbon gas to a plurality of reaction gases for forming the at least one inorganic layer and gradually changing at least one of a flow rate of the hydrocarbon gas or a flow rate of the plurality of reaction gases.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
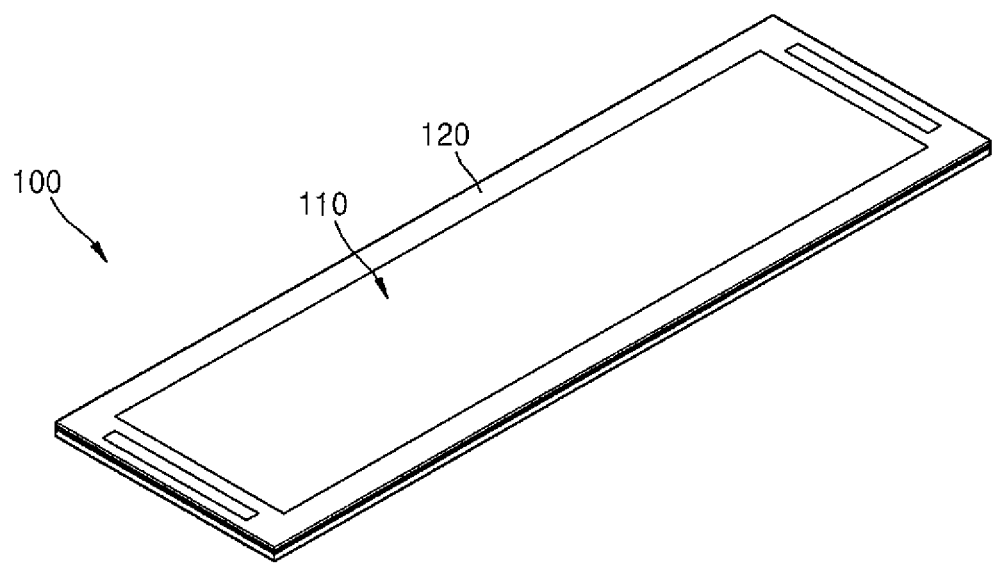
FIG. 1 is a perspective view of a flexible display apparatus in an unrolled state, according to an embodiment of the present invention.

In the following detailed description, certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In the following description, functions or constructions not necessary for understanding of the invention are omitted for clarity.

Although terms, such as 'first' and 'second', can be used to describe various elements, the elements are not limited by the terms. The terms can be used to differentiate a certain element from another element.

The terminology used in the application is used only to describe specific embodiments and does not have any intention to limit the present disclosure. An expression in the singular also includes an expression in the plural unless the expressions are clearly different from each other in context. In the following description, it should be understood that terms, such as 'include' and 'have', are used to indicate the existence of an implemented feature, number, step, operation, element, part, or a combination thereof without excluding in advance the possibility of the existence or addition of one or more other features, numbers, steps, operations, elements, parts, or combinations thereof.

Reference will now be made to embodiments, examples of which are illustrated in the accompanying drawings, wherein like reference numerals refer to like elements throughout. Here, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, a flexible display apparatus and a manufacturing method thereof according to one or more embodiments of the present invention will be described with reference to the accompanying drawings. Like reference numerals in the drawings denote like elements, and thus repetitive descriptions will be omitted.

Figure 2:
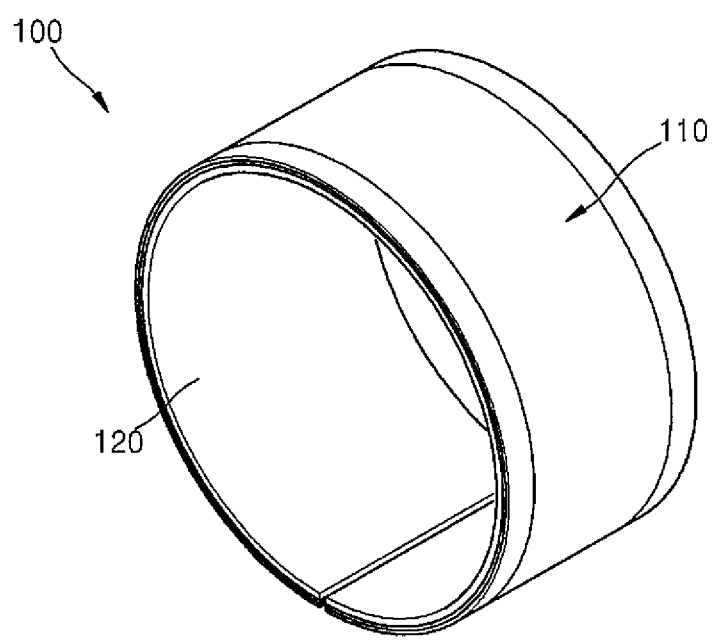
FIG. 2 is a perspective view of the flexible display apparatus shown in FIG. 1 in a rolled state.

FIG. 1 is a perspective view of a flexible display apparatus 100 in an unrolled state, according to an embodiment of the present invention, and FIG. 2 is a perspective view of the flexible display apparatus 100 shown in FIG. 1 in a rolled state.

Referring to FIGS. 1 and 2, the flexible display apparatus 100 includes a flexible display panel 110 for displaying an image and a flexible holder 120 on which the flexible display panel 110 is mounted. The flexible display panel 110 includes a flexible substrate on which a display unit (i.e. a region for implementing a screen) is formed. The flexible display panel 110 may further include a touch screen, a polarization plate, and/or various other thin layers.

In the present embodiment, the flexible display apparatus 100 is referred to as an organic light-emitting display apparatus but may also be utilized in other flexible display apparatuses, such as a liquid crystal display apparatus, a field emission display apparatus, an electronic paper display apparatus, and the like.

The flexible display apparatus 100 may allow a user to view images while the flexible display apparatus 100 is in various states, such as an unrolled state, a rolled state, and the like, according to circumstances.

Figure 3:
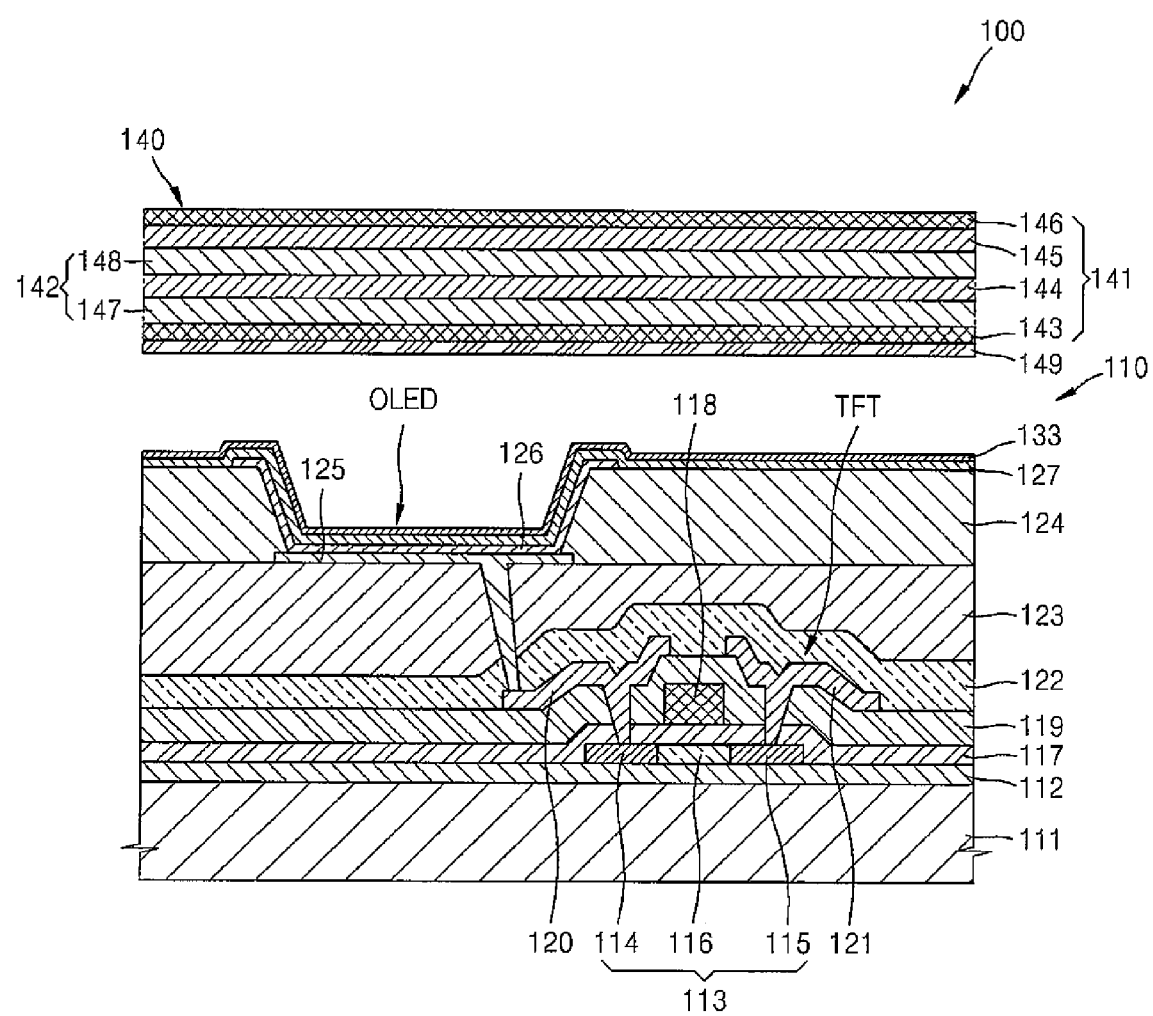
FIG. 3 is a cross-sectional view of one sub-pixel of the flexible display apparatus shown in FIG. 1, according to an embodiment of the present invention.
Figure 4:
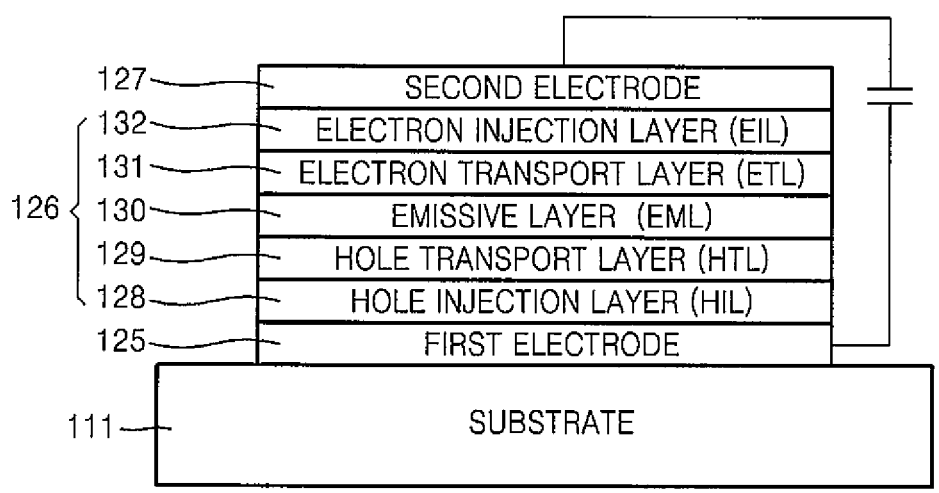
FIG. 4 is a configuration diagram of an organic light-emitting device in the sub-pixel shown in FIG. 3, according to an embodiment of the present invention.

FIG. 3 is a cross-sectional view of one sub-pixel of the flexible display apparatus 100 shown in FIG. 1, according to an embodiment of the present invention, and FIG. 4 is a configuration diagram of an organic light-emitting device OLED in the sub-pixel shown in FIG. 3, according to an embodiment of the present invention.

Herein, each of the sub-pixels includes a thin-film transistor TFT and an organic light-emitting device OLED. The thin-film transistor TFT does not necessarily have the structure shown in FIG. 3, and the number and structures of thin-film transistors may be variously changed.

Referring to FIGS. 3 and 4, the flexible display panel 110 includes a flexible substrate 111. The flexible substrate 111 may be formed of any suitable insulating material having flexibility. For example, the flexible substrate 111 may be formed of a polymer material, such as polyimide (PI), polycarbonate (PC), polyethersulfone (PES), polyethylene terephthalate (PET), polyethylenenaphthalate (PEN), polyarylate (PAR), fiberglass reinforced plastic (FRP), or the like. Alternatively, the flexible substrate 111 may be formed of flexible thin glass, but the flexible substrate 111 is not limited thereto.

The flexible substrate 111 may be transparent, translucent, or opaque, but the flexible substrate 111 is not limited thereto.

A barrier layer 112 is positioned on the flexible substrate 111. In one embodiment, the barrier layer 112 covers the entire upper surface of the flexible substrate 111. In one embodiment, the barrier layer 112 includes an inorganic layer or an organic layer.

For example, the barrier layer 112 may be formed of a material selected from inorganic materials, such as silicon oxide ($SiO_x$), silicon nitride ($SiN_x$), silicon oxynitride ($SiO_xN_y$), aluminum oxide ($AlO_x$), aluminum nitride (AlNx), or the like, or organic materials, such as acryl, polyimide (PI), polyester, or the like, but the barrier layer 112 is not limited thereto. The barrier layer 112 may include a single layer or a plurality of layers.

In one embodiment, the barrier layer 112 blocks oxygen and moisture, prevents diffusion of moisture or impurities through the flexible substrate 111, and provides a planar surface on the upper surface of the flexible substrate 111.

A thin-film transistor TFT is positioned on the barrier layer 112. The present embodiments illustrate a thin-film transistor TFT of a top gate type, but the thin-film transistor is not limited thereto and a thin-film transistor of another structure, such as a bottom gate type or the like, may be provided.

The thin-film transistor TFT includes a semiconductor active layer 113 positioned on the barrier layer 112. In one embodiment, the semiconductor active layer 113 includes a source region 114 and a drain region 115 formed by doping N-type impurity ions or P-type impurity ions. A region between the source region 114 and the drain region 115 is a channel region 116, in which no impurities are doped.

The semiconductor active layer 113 may be formed by changing amorphous silicon to polysilicon through crystallization of the amorphous silicon.

To crystalize amorphous silicon, various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like, may be utilized.

A method that does not utilize a high-temperature heating process may be used for the flexible substrate 111 of the present embodiments. For example, when crystallization of the amorphous silicon is performed by a low-temperature polysilicon (LTPS) process, the period of time the flexible substrate 111 is exposed to a relatively high temperature, e.g., a temperature of about 450° C. or higher, is minimized by irradiating a laser only for a short time to activate the semiconductor active layer 113.

Alternatively, the semiconductor active layer 113 may be formed of an oxide semiconductor, but the semiconductor active layer 113 is not limited thereto.

In one embodiment, the oxide semiconductor may include an oxide of a material selected from group 12, group 13, or group 14 metallic elements, such as zinc (Zn), indium (In), gallium (Ga), tin (Sn), cadmium (Cd), germanium (Ge), or hafnium (Hf), or combinations thereof.

In one embodiment, a gate insulating layer 117 is evaporated and deposited on the semiconductor active layer 113 by evaporation. In one embodiment, the gate insulating layer 117 includes an inorganic layer, such as a silicon oxide, a silicon nitride, or a metal oxide, and may include a single layer or a plurality of layers.

In one embodiment, a gate electrode 118 is positioned in a certain region on the gate insulating layer 117. The gate electrode 118 may include a single layer or multiple layers of gold (Au), silver, (Ag), copper (Cu), nickel (Ni), platinum (Pt), palladium (Pd), aluminum (Al), molybdenum (Mo), or chromium (Cr), or an alloy, such as an aluminum (Al):neodymium (Nd) alloy, a molybdenum (Mo):tungsten (W) alloy.

In one embodiment, n interlayer insulating layer 119 is positioned on the gate electrode 118. The interlayer insulating layer 119 may be formed of an insulating inorganic layer of a silicon oxide, a silicon nitride, or the like. Alternatively, the interlayer insulating layer 119 may be formed of an insulating organic layer, but the interlayer insulating layer 119 is not limited thereto.

In one embodiment, a source electrode 120 and a drain electrode 121 are positioned on the interlayer insulating layer 119. The source electrode 120 and the drain electrode 121 are electrically connected (or coupled) to the source region 114 and the drain region 115, respectively, through contact holes formed by selectively removing the gate insulating layer 117 and the interlayer insulating layer 119 (e.g. removing one or more portions of the gate insulating layer 117 and one or more portions of the interlayer insulating layer 119).

In one embodiment, a passivation layer 122 is positioned on the source electrode 120 and the drain electrode 121. The passivation layer 122 may be formed of an inorganic layer of a silicon oxide, a silicon nitride, or the like or an organic layer, but the passivation layer 122 is not limited thereto.

In one embodiment, a planarization layer 123 is positioned on the passivation layer 122. In one embodiment, the planarization layer 123 includes an organic layer of acryl, polyimide (PI), benzocyclobutene (BCB), or the like.

In one embodiment, an organic light-emitting device OLED is formed on the thin-film transistor TFT.

According to embodiments of the present invention, in order to form the organic light-emitting device OLED, a first electrode 125 (as a pixel electrode) is electrically connected (or coupled) through a contact hole to the source electrode 120 or the drain electrode 121.

In one embodiment, the first electrode 125 functions as an anode and may be formed of various conductive materials. For example, the first electrode 125 may be formed as a transparent electrode or a reflective electrode depending on its purpose, but the first electrode 125 is not limited thereto.

When the first electrode 125 is formed as a transparent electrode, the first electrode 125 may include an indium tin oxide (ITO), an indium zinc oxide (IZO), a zinc oxide (ZnO), an indium oxide ($In_2O_3$), or the like, and when the first electrode 125 is formed as a reflective electrode, a reflective layer may be formed of Ag, magnesium (Mg), Al, Pt, Pd, Au, Ni, Nd, iridium (Ir), Cr, or a compound thereof, and ITO, IZO, ZnO, $In_2O_3$, or the like may be formed on the reflective layer.

In one embodiment, a pixel defining layer (PDL) 124 is positioned on the planarization layer 123 to cover the edge of the first electrode 125. In one embodiment, the PDL 124 surrounding the edge of the first electrode 125 defines an emission region of each sub-pixel.

In one embodiment, the PDL 124 is formed of an organic layer or an inorganic layer.

For example, the PDL 124 may be formed of an organic material, such as polyimide (PI), polyamide, benzocyclobutene (BCB), an acryl resin, a phenol resin, or the like, or an inorganic material, such as $SiN_x$, but the PDL 124 is not limited thereto. The PDL 124 may be include a single layer or a plurality of layers, and may be variously changed.

In one embodiment, an intermediate layer 126 is positioned on the first electrode 125, where the portion of the first electrode 125 is not covered by the PDL 124 and is exposed. The intermediate layer 126 may be formed by a vapor deposition process, but the method for forming the intermediate layer 126 is not limited thereto.

According to the present embodiment, the intermediate layer 126 is patterned to correspond to each sub-pixel, i.e. to the patterned first electrode 125. However, the configuration of the intermediate layer 126 is provided here for convenience of description of a configuration of a sub-pixel, and various embodiments of the intermediate layer 126 may be implemented.

The intermediate layer 126 may be formed of a low-molecular weight organic material or a high-molecular weight organic material, but the intermediate layer 126 is not limited thereto.

In one embodiment, as shown in FIG. 4, the intermediate layer 126 includes an organic emission layer 130 and may further include at least one of a hole injection layer (HIL) 128, a hole transport layer (HTL) 129, an electron transport layer (ETL) 131, or an electron injection layer (EIL) 132. However, the intermediate layer 126 is not limited thereto and may include other various function layers in addition to the organic emission layer 130.

Referring back to FIG. 3, a second electrode 127 (as a common electrode of the organic light-emitting device OLED) is positioned on the intermediate layer 126. The second electrode 127 may be formed as a transparent electrode or a reflective electrode, similar to the first electrode 125.

In one embodiment, the first electrode 125 and the second electrode 127 are insulated from each other by the intermediate layer 126. If a voltage is applied between the first electrode 125 and the second electrode 127, the intermediate layer 126 emits visible light, thereby realizing an image which can be recognized by a user.

In one embodiment, the second electrode 127 may be formed as a transparent electrode or a reflective electrode, but the second electrode 127 is not limited thereto.

When the second electrode 127 is formed as a transparent electrode, a compound having a small work function, such as lithium (Li), calcium (Ca), lithium fluoride/calcium (LiF/Ca), lithium fluoride/aluminum (LiF/Al), aluminum (Al), magnesium (Mg), or a combination thereof, may be initially deposited on the intermediate layer 126 by evaporation, and a transparent electrode forming material, such as ITO, IZO, ZnO, $In_2O_3$, or the like, may be formed thereon.

When the second electrode 127 is formed as a reflective electrode, the second electrode 127 may be formed by evaporating Li, Ca, LiF/Ca, LiF/Al, Al, Mg, or a compound thereof on the entire surface of the flexible substrate.

When the first electrode 125 is formed as a transparent electrode or a reflective electrode, the first electrode 125 may be formed in a shape corresponding to an aperture of each sub-pixel. The second electrode 127 may be formed by evaporating a transparent electrode or a reflective electrode on the entire surface of the flexible substrate. Alternatively, the second electrode 127 may be formed in a variety of suitable patterns, instead of being formed on the entire surface by vapor deposition. The first electrode 125 and the second electrode 127 may be stacked in a reverse position.

A capping layer 133 for protecting the organic light-emitting device OLED may be further positioned on the second electrode 127.

A thin-film encapsulating layer 140 is positioned on the organic light-emitting device OLED. In one embodiment, the thin-film encapsulating layer 140 protects the intermediate layer 126 and other thin layers from external moisture, oxygen, and the like.

In one embodiment, the thin-film encapsulating layer 140 includes an inorganic layer 141 and an organic layer 142 The inorganic layer 141 may include a first inorganic layer 143, a second inorganic layer 144, a third inorganic layer 145, and a fourth inorganic layer 146. The organic layer 142 may include a first organic layer 147 and a second organic layer 148. In one embodiment, the thin-film encapsulating layer 140 has a stacked structure of at least one of each of the inorganic layer 141 and the organic layer 142. A halogenated metal layer 149 including LiF may be further positioned between the organic light-emitting device OLED and the first inorganic layer 143.

According to the present embodiment, the thin-film encapsulating layer 140 includes the halogenated metal layer 149 including LiF, the first inorganic layer 143 including a first aluminum oxide ($AlO_x$), the first organic layer 147 including a first monomer, the second inorganic layer 144 including a first silicon oxynitride ($SiO_xN_y$), the second organic layer 148 including a second monomer, the third inorganic layer 145 including a second silicon oxynitride ($SiO_xN_y$), and the fourth inorganic layer 146 including a second aluminum oxide ($AlO_x$), which are sequentially stacked in a direction away from the organic light-emitting device OLED.

In one embodiment, the halogenated metal layer 149 including LiF is a buffer layer for protecting the organic emission layer 130 and the capping layer 133 from the strong plasma generated when the first inorganic layer 143 is evaporated. In one embodiment, the halogenated metal layer 149 is evaporated using an evaporator.

In one embodiment, the first inorganic layer 143 including the first aluminum oxide ($AlO_x$) is evaporated and deposited by a sputtering method, but the method for deposition of the first inorganic layer 143 is not limited thereto.

The halogenated metal layer 149 and/or the first inorganic layer 143 may function to distribute gases, such as hydrogen oxide ($H_2O$) and oxygen ($O_2$).

In one embodiment, the first organic layer 147 including the first monomer planarizes a lower layer thereof and acts as a particle coverage.

In one embodiment, the second inorganic layer 144 including the first silicon oxynitride ($SiO_xN_y$) acts as a main barrier layer. The second inorganic layer 144 prevents diffusion of $H_2O$ and $O_2$ into the flexible substrate. In one embodiment, the second inorganic layer 144 is evaporated and deposited by a chemical vapor deposition (CVD) method, but the method for deposition of the second inorganic layer 144 is not limited thereto.

In one embodiment, the second organic layer 148 including the second monomer planarizes a lower layer thereof and acts as a particle coverage.

In one embodiment, the third inorganic layer 145 including the second silicon oxynitride ($SiO_xN_y$) functions as a barrier and prevents diffusion of $H_2O$ and $O_2$ into the flexible substrate. In one embodiment, the third inorganic layer 145 is evaporated and deposited by a CVD method, but the method for deposition of the third inorganic layer 145 is not limited thereto.

The fourth inorganic layer 146 including the second aluminum oxide ($AlO_x$) is evaporated and deposited by a sputtering method, but the method for deposition of the fourth inorganic layer 146 is not limited thereto.

The inorganic layer 141 may be formed of at least one of aluminum oxide ($AlO_x$) silicon oxynitride ($SiO_xN_y$), silicon oxide ($SiO_x$), silicon nitride ($SiN_x$), silicon carbide ($SiC_x$), titanium oxide ($TiO_x$), zirconium oxide ($ZrO_x$), or zinc oxide (ZnO).

The organic layer 142 may be formed of at least one monomer selected from epoxy, polyimide (PI), polyethylene terephthalate (PET), polycarbonate (PC), polyethylene (PE), or polyacrylate.

In one embodiment, the inorganic layer 141 may include at least two layers, and in some embodiments the organic layer 142 may include at least one layer. The uppermost fourth inorganic layer 146 of the thin-film encapsulating layer 140 is exposed to the outside, and may include an inorganic layer capable of preventing the diffusion of moisture into the organic light-emitting device OLED.

In one embodiment, the second inorganic layer 144 and the third inorganic layer 145 are relatively thicker than the first and fourth inorganic layers 143 and 146 to more effectively act as barrier layers.

In some embodiment, the thicker the second inorganic layer 144 and the third inorganic layer 145 are, the better the barrier layer function. However, stress also increases, and is directly proportional to the increase of the thickness of the inorganic layer. Accordingly, delamination can occur at the borders of the stacked thin layers.

Furthermore, if a sharp change in a composition occurs at the interface between the inorganic layer and the organic layer (e.g., if there is a relatively large difference in the composition at the interface between the first organic layer 147 and the second inorganic layer 144), then, when the flexible display apparatus 100 is bent, stress is concentrated at the interface between the first organic layer 147 and the second inorganic layer 144. Accordingly, crack generation and delamination occurs at the interface between the stacked thin layers.

In an attempt to reduce a sharp change in the composition at the interface between the organic layer and the inorganic layer, in embodiments of the present invention, carbon having a concentration gradient is distributed between the organic layer and the inorganic layer to realize a smoother transition in composition.

Hereinafter, although the first organic layer 147 and the second inorganic layer 144 are illustrated in the present embodiments, the reduction of a sharp change in a composition is applicable to any case where an organic layer and an inorganic layer are stacked, such as, for example, a case where the second organic layer 148 and the third inorganic layer 145 are stacked.

In one embodiment, the second inorganic layer 144 may act as a main barrier layer among the plurality of thin layers forming the thin-film encapsulating layer 140 and may include the first silicon oxynitride ($SiO_xN_y$).

In one embodiment, the second inorganic layer 144 is evaporated and deposited on the first organic layer 147. During this process, carbon content (e.g. by weight) is varied to achieve a carbon concentration gradient between the first organic layer 147 and the second inorganic layer 144.

When the second inorganic layer 144 is evaporated on the first organic layer 147, as the reaction between reaction gases injected to form the second inorganic layer 144 proceeds, carbon content gradually varies. In one embodiment, to prevent (or reduce) a sharp change in the composition at the interface between the first organic layer 147 and the second inorganic layer 144, carbon content is gradually decreased from the first organic layer 147 to the second inorganic layer 144.

In some embodiments of the present invention, carbon has a concentration gradient at the interface between the first organic layer 147 and the second inorganic layer 144, resulting in a relatively smooth change in the composition at the interface between the first organic layer 147 and the second inorganic layer 144. Accordingly, when the flexible display apparatus 100 is bent, stress is prevented (or suppressed) from concentrating on the interface between the first organic layer 147 and the second inorganic layer 144, and therefore, crack generation and delamination at the point of contact of the first organic layer 147 and the second inorganic layer 144 may be prevented or suppressed.

The second inorganic layer 144 having the structure described above may be formed on the first organic layer 147 by a vapor deposition process performed by a CVD device at a low temperature.

Figure 5:
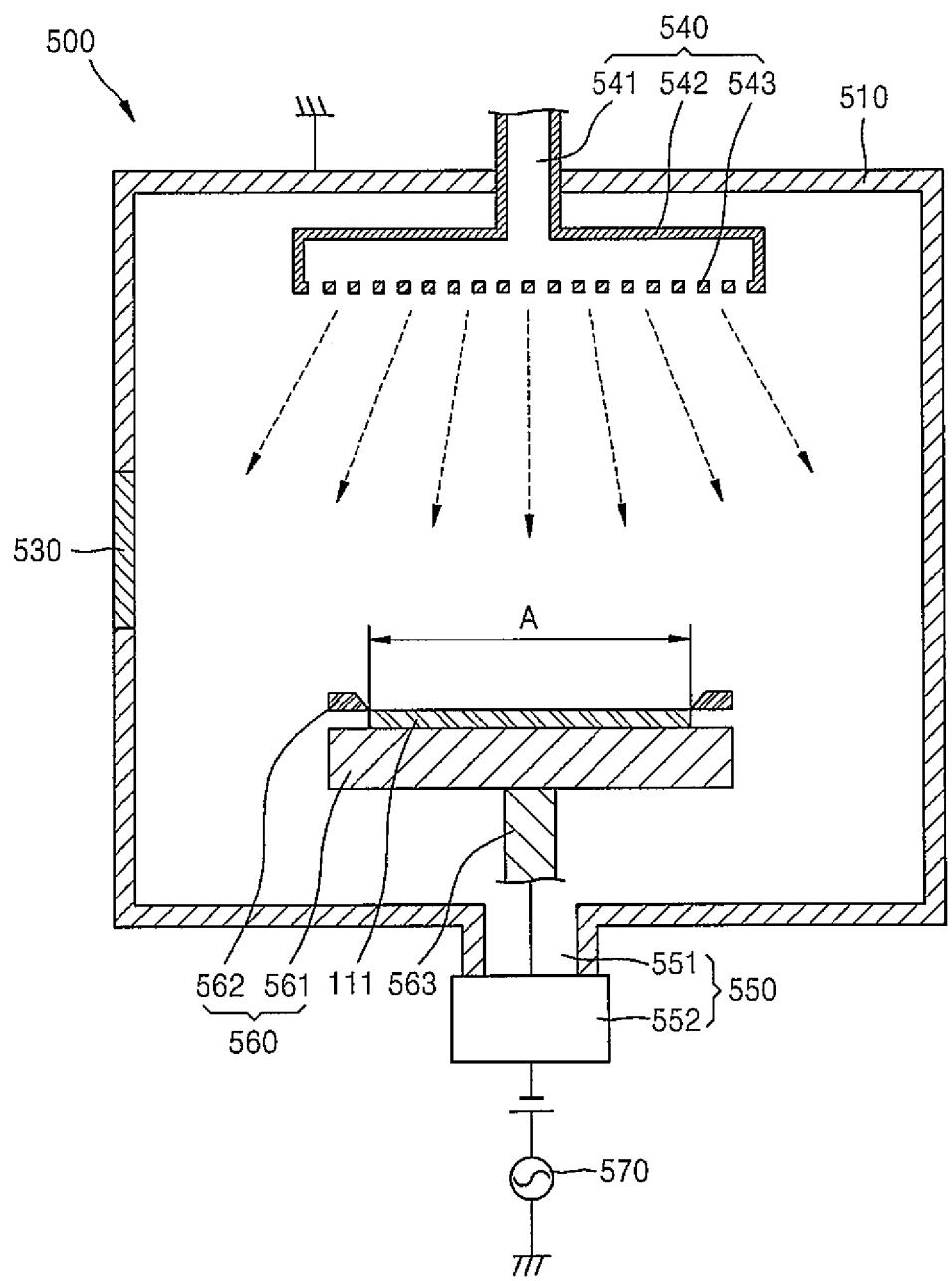
FIG. 5 is a cross-sectional view of a vacuum chamber including a flexible display panel of the flexible display apparatus shown in FIG. 1, according to an embodiment of the present invention.

FIG. 5 is a cross-sectional view of a thin-film vapor deposition device 500 for forming the second inorganic layer 144, according to an embodiment of the present invention.

The thin-film vapor deposition device 500 includes a chamber 510. In one embodiment, the chamber 510 functions to separate a reaction space from an external environment. A door 530 through which a transfer device for transferring the flexible substrate 111 from the outside of the chamber 510 to the inside is inserted, may be provided at one side of the chamber 510. However, a position or size of the door 530 is not limited thereto.

In one embodiment, a gas injection part 540 is provided at an upper side of the chamber 510, and a gas discharge part 550 is provided at a lower side of the chamber 510 to face the gas injection part 540.

In one embodiment, the gas injection part 540 includes a gas injection port 541 and a shower head 542 connected to the gas injection port 541. Materials for vapor deposition (e.g. reaction gases) are injected from the outside into the chamber 510 through the gas injection port 541, and the injected gases are substantially uniformly sprayed over a deposition region A through the shower head 542.

In one embodiment, the shower head 542 includes a plurality of evenly spaced apart spray holes 543 on the lower surface of the shower head 542, and the plurality of spray holes 543 are configured to substantially uniformly distribute the gases to the deposition region A, thereby improving the uniformity of deposition of the second inorganic layer 144 on the flexible substrate 111. In some embodiments, the plurality of spray holes 543 of the shower head 542 may be unevenly spaced apart from each other, and in other embodiments, the shower head 542 may not be provided. In one embodiment, the shower head 542 is grounded to be used as one electrode for plasma discharge.

In one embodiment, the gas discharge part 550 is provided at the lower side of the chamber 510 to face the gas injection part 540. In some embodiments, the gas discharge part 550 includes an exhaust port 551 for exhausting (or expelling) gases to the outside of the chamber 510 and a vacuum pump 552 connected to the exhaust port 551 and configured to maintain a certain degree of vacuum inside the chamber 510.

As described above, since the gas injection part 540 and the gas discharge part 550 are positioned to face each other at the upper and lower sides of the chamber 510, respectively, a minute (i.e. small) air current from the upper part of the chamber 510 toward the lower part inside the chamber 510 is generated.

According to the present embodiment, respective positions of the gas injection part 540 and the gas discharge part 550 may be variously changed, as long as the gas injection part 540 and the gas discharge part 550 remain facing each other, and the minute (i.e. small) air current formed inside the chamber 510 may be between the gas injection part 540 and the gas discharge part 550.

In one embodiment, a deposition part 560 including a susceptor 561 on which the flexible substrate 111 is positioned and an open mask 562 is located between the gas injection part 540 and the gas discharge part 550. As the reaction gases supplied for the formation of the second inorganic layer 144 react, the second inorganic layer 144 is formed on the flexible substrate 111 positioned on the susceptor 561. According to the present embodiment, the open mask 562 is mounted along the edges of the flexible substrate 111 to facilitate uniform vapor deposition and the like on the flexible substrate 111. In one embodiment, a thin layer is formed on an inner part of the open mask 562, and the region where the thin layer is formed becomes the deposition region A.

The susceptor 561 may further include a heater for supplying thermal energy to the flexible substrate 111 and may be connected (or coupled) to a radio frequency (RF) power source 570 to be used as the other electrode for plasma discharge.

In one embodiment, an elevating part 563 positioned below the susceptor 561 may move the flexible substrate 111 upward or downward along the vertical axis, and thus, may increase or reduce the distance between the gas injection part 540 and the flexible substrate 111, thereby adjusting the size of the area in which the reaction gases react.

To facilitate uniform evaporation and deposition of a thin-film layer, the deposition part 560 may be positioned substantially perpendicular to the direction in which the gas injection part 540 and the gas discharge part 550 face each other, but the position of the deposition part 560 is not limited thereto.

In the embodiments where the deposition part 560 is positioned perpendicular to the direction in which the gas injection part 540 and the gas discharge part 550 face each other, the gases sprayed from the shower head 542 are substantially uniformly deposited onto the flexible substrate 111. In one embodiment, the gases that participated in the reaction and were evaporated are sprayed onto the flexible substrate 111, while the gases that were not evaporated are discharged to the outside of the chamber 510 through the exhaust port 551.

In one embodiment, a thin layer, such as, for example, the second inorganic layer 144, may be evaporated and deposited in a desired (or predetermined) region on the flexible substrate 111 by using the thin-film vapor deposition device 500 described above.

A method of forming a thin layer by using the thin-film vapor deposition device 500, according to an embodiment of the present invention, will now be described.

First, vacuum is created the inside the chamber 510 by a vacuum pump. The flexible substrate 111 is then inserted inside the chamber 510 through the door 530 and loaded on the susceptor 561.

Next, the flexible substrate 111 is heated to a predeterminded temperature by heating the susceptor 561, on which the flexible substrate 111 is positioned, with a heater. Reaction gases at a predetermined flow rate controlled by a control device, such as a mass flow controller (MFC), are introduced into the chamber 510 through the gas injection port 541.

The reaction gases may vary according to the type of a layer to be formed on the flexible substrate 111. According to the present embodiment, the reaction gases introduced into the chamber 510 would form the first organic layer 147 on the flexible substrate 111 and then would form the second inorganic layer 144 on the first organic layer 147. In one embodiment, the reaction gases would form a $SiO_xN_y$ layer.

In one embodiment, silicon hydride such as silane ($SiH_4$), nitrogen oxide ($N_2O$), and any one of nitrogen hydride such as ammonia ($NH_3$) or nitrogen gas ($N_2$) are then injected as first, second, and third reaction gases, respectively. In one embodiment, a hydrocarbon gas is used as a fourth reaction gas to form a carbon having a concentration gradient at the interface between the first organic layer 147 and the second inorganic layer 144. In one embodiment, the hydrocarbon gas includes carbon hydride such as methane ($CH_4$).

After passing through a hollow structure inside the shower head 542, each of the first to fourth reaction gases are substantially uniformly sprayed towards the flexible substrate 111 through the plurality of spray holes 543.

Next, power is applied by the RF power source 570 to form a plasma reaction field near the surface of the flexible substrate 111. The second inorganic layer 144 is then evaporated on the flexible substrate 111 by a chemical reaction in the plasma reaction field. Finally, the inside of the chamber 510 is purged by an inert gas or the like. Thereafter, the flexible substrate 111 is deposited and cleaned.

In one embodiment, after the second inorganic layer 144 is evaporated, reaction times and/or reaction quantities of the first to fourth reaction gases are adjusted. Specifically, a flow rate of the fourth reaction gas is adjusted so that the concentration (e.g. by weight) of carbon gradually decreases from the first organic layer 147 to the second inorganic layer 144.

Accordingly, carbon having a concentration gradient may be distributed between the first organic layer 147 and the second inorganic layer 144.

Figure 6:
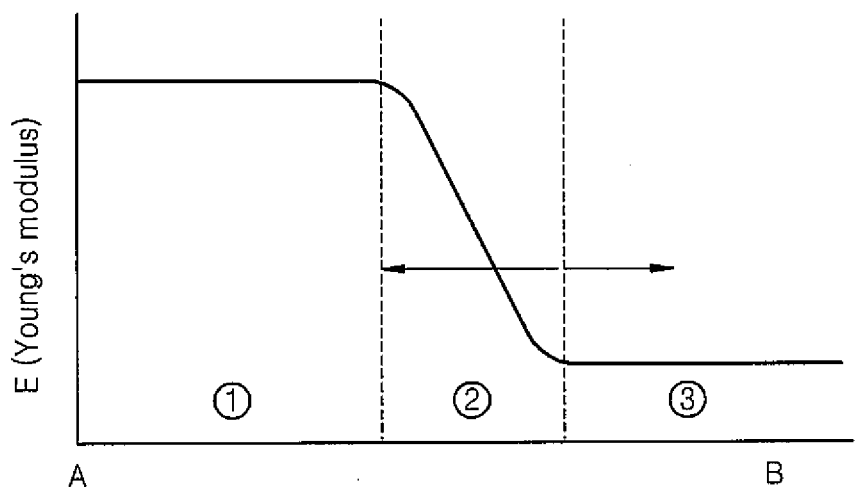
FIG. 6 is a graph showing a change in carbon content of an organic layer and an inorganic layer of the flexible display apparatus, according to an embodiment of the present invention.

FIG. 6 is a graph showing carbon content according to embodiments of the present invention.

In FIG. 6, an X axis (i.e. horizontal axis) corresponds to a line along which the stacked first organic layer 147 and second inorganic layer 144 were vertically cut. Region ① indicates a region where the second inorganic layer 144 is formed, region ② indicates an interface between the first organic layer 147 and the second inorganic layer 144, and region ③ indicates a region where the first organic layer 147 is formed. A Y axis (i.e. vertical axis) corresponds to a Young's modulus E.

Referring to the graph of FIG. 6, carbon content gradually decreases (from B to A) from the region ③ where the first organic layer 147 is formed to the region ① where the second inorganic layer 144 is formed.

In the region ③ where the first organic layer 147 is formed, carbon content (e.g. by weight) is from about 70% to about 100%. In contrast, in the region ① where the second inorganic layer 144 is formed, carbon content is from about 0% to about 15%.

Ideally, in the region ① where the second inorganic layer 144 is formed, carbon content will be 0%. However, a process of forming the thin-film encapsulating layer 140 is performed in one vacuum chamber. As such, a portion of plasma generated during the formation of the first organic layer 147, for example, is inevitably included in the second inorganic layer 144.

In one embodiment, at the interface between the first organic layer 147 and the second inorganic layer 144 (denoted in FIG. 6 as region ②), $CH_4$ is included as one of the reaction gases, and different carbon content ranging from about 15% to about 70% is achieved in the region ② by gradually changing the flow rate of $CH_4$.

In one embodiment, the carbon content in the region ② is gradually decreased from the first organic layer 147 to the second inorganic layer 144 by gradually reducing the flow rate of $CH_4$. When carbon content has a negative (−) concentration gradient, Young's modulus also gradually varies in an inverse proportion to the carbon content.

Accordingly, a sharp change (or a sharp difference) in the Young's modulus at the interface between the first organic layer 147 and the second inorganic layer 144 (denoted in FIG. 6 as the region ②) is reduced, thereby preventing or reducing the stress exerted at the interface between the first organic layer 147 and the second inorganic layer 144 when the flexible display apparatus 100 is bent. Accordingly, cracking and peeling may be minimized.

In some embodiments, the thickness of an inorganic layer is the same in both the thin-film encapsulating layer 140 having a concentration gradient of carbon at the interface between the first organic layer 147 and the second inorganic layer 144 and a comparable thin-film encapsulating layer which does not have a concentration gradient of carbon at an interface between an inorganic layer and an organic layer. As such, both the comparable thin-film encapsulating layer and the thin-film encapsulating layer 140 have the same (or substantially the same) barrier layer function. However, the concentration gradient of carbon at the interface between the first organic layer 147 and the second inorganic layer 144 of the present embodiments, eliminates or reduces a sharp change (or a sharp difference) in Young's modulus, thereby improving a mechanical characteristics of the flexible display.

FIGS. 7 to 10 are cross-sectional views of flexible display panels 710, 810, 910, and 1010, respectively, in each of which carbon having a concentration gradient is distributed at an interface between an inorganic layer and an organic layer, according to embodiments of the present invention.

Figure 7:
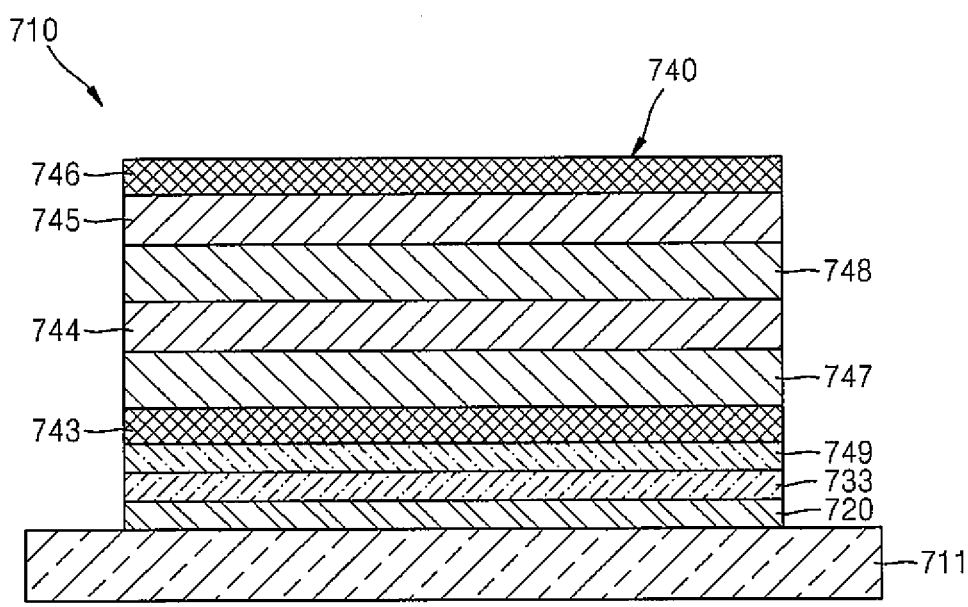
FIG. 7 is a cross-sectional view of a flexible display panel according to another embodiment of the present invention.

Referring to FIG. 7, in the flexible display panel 710, a display unit 720 is formed on a flexible substrate 711. The display unit 720 includes at least one thin-film transistor and an organic light-emitting device electrically connected to (or coupled to) the at least one thin-film transistor and including a first electrode, an intermediate layer having an organic emission layer, and a second electrode. A capping layer 733 is formed on the display unit 720.

A thin-film encapsulating layer 740 is formed on the display unit 720 or on the capping layer 733.

According to the present embodiment, the thin-film encapsulating layer 740 includes a halogenated metal layer 749 including lithium fluoride (LiF), a first inorganic layer 743 including a first aluminum oxide ($AlO_x$), a first organic layer 747 including a first monomer, a second inorganic layer 744 including a first silicon oxide ($SiO_x$), a second organic layer 748 including a second monomer, a third inorganic layer 745 including a second silicon oxide ($SiO_x$), and a fourth inorganic layer 746 including a second aluminum oxide ($AlO_x$), which are sequentially stacked away from the display unit 720.

In one embodiment, at the interface between the first organic layer 747 and the second inorganic layer 744 and at the interface between the second organic layer 748 and the third inorganic layer 745, a hydrocarbon gas such as $CH_4$ is added to reaction gases $SiH_4$ and $N_2O$, used to form the second inorganic layer 744 and the third inorganic layer 745, and the flow rate of $CH_4$ is gradually changed by adjusting reaction times and/or reaction quantities of the reaction gases.

Accordingly, at the interface between the first organic layer 747 and the second inorganic layer 744 and at the interface between the second organic layer 748 and the third inorganic layer 745, carbon has a concentration gradient such that carbon content gradually decreases from the first organic layer 747 to the second inorganic layer 744 and from the second organic layer 748 to the third inorganic layer 745, respectively.

Figure 8:
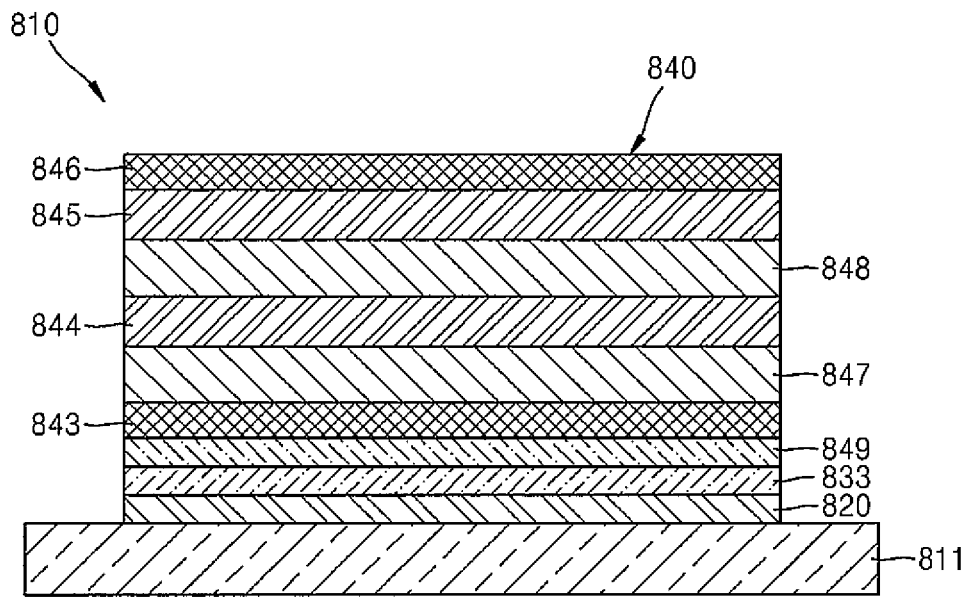
FIGS. 8 to 10 are cross-sectional views of flexible display panels according to other embodiments of the present invention.

Referring to FIG. 8, in the flexible display panel 810, a display unit 820 is formed on a flexible substrate 811. A capping layer 833 is formed on the display unit 820.

A thin-film encapsulating layer 840 is formed on the display unit 820 or on the capping layer 833.

According to the present embodiment, the thin-film encapsulating layer 840 includes a halogenated metal layer 849 including lithium fluoride (LiF), a first inorganic layer 843 including a first aluminum oxide ($AlO_x$), a first organic layer 847 including a first monomer, a second inorganic layer 844 including a first silicon nitride ($SiN_x$), a second organic layer 848 including a second monomer, a third inorganic layer 845 including a second silicon nitride ($SiN_x$), and a fourth inorganic layer 846 including a second aluminum oxide ($AlO_x$), which are sequentially stacked away from the display unit 820.

In one embodiment, when the second inorganic layer 844 and the third inorganic layer 845 are evaporated and deposited on the first organic layer 847 and the second organic layer 848, respectively, a hydrocarbon gas such as $CH_4$ is added to reaction gases $SiH_4$ and any one of $NH_3$ and $N_2$, used to form the second inorganic layer 844 and the third inorganic layer 845, and the flow rate of $CH_4$ is gradually changed.

Accordingly, at the interface between the first organic layer 847 and the second inorganic layer 844 and at the interface between the second organic layer 848 and the third inorganic layer 845, carbon content gradually decreases from the first organic layer 847 to the second inorganic layer 844 and from the second organic layer 848 to the third inorganic layer 845, respectively.

Figure 9:
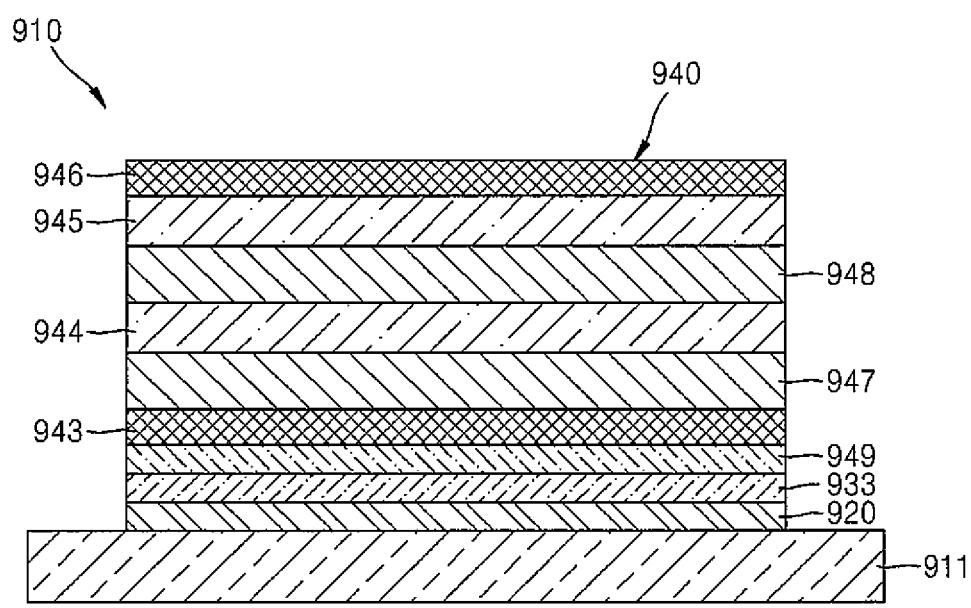

Referring to FIG. 9, in the flexible display panel 910, a display unit 920 is formed on a flexible substrate 911. A capping layer 933 is formed on the display unit 920.

A thin-film encapsulating layer 940 is formed on the display unit 920 or on the capping layer 933.

According to the present embodiment, the thin-film encapsulating layer 940 includes a halogenated metal layer 949 including lithium fluoride (LiF), a first inorganic layer 943 including a first aluminum oxide ($AlO_x$), a first organic layer 947 including a first monomer, a second inorganic layer 944 including a composite-layer structure of a first silicon oxide/first silicon nitride ($SiO_x/SiN_x$), a second organic layer 948 including a second monomer, a third inorganic layer 945 including a composite-layer structure of a second silicon oxide/second silicon nitride ($SiO_x/SiN_x$), and a fourth inorganic layer 946 including a second aluminum oxide ($AlO_x$), which are sequentially stacked away from the display unit 920.

In this case, at the interface between the first organic layer 947 and the second inorganic layer 944 and at the interface between the second organic layer 948 and the third inorganic layer 945, a hydrocarbon gas such as $CH_4$ is added to reaction gases $SiH_4$, $N_2O$ and any one of $NH_3$ and $N_2$, used to form the second inorganic layer 944 and the third inorganic layer 945, and the flow rate of $CH_4$ is gradually changed by adjusting reaction times and/or reaction quantities of the reaction gases.

Accordingly, at the interface between the first organic layer 947 and the second inorganic layer 944 and at the interface between the second organic layer 948 and the third inorganic layer 945, carbon has a concentration gradient such that carbon content gradually decreases from the first organic layer 947 to the second inorganic layer 944 and from the second organic layer 948 to the third inorganic layer 945, respectively.

Figure 10:
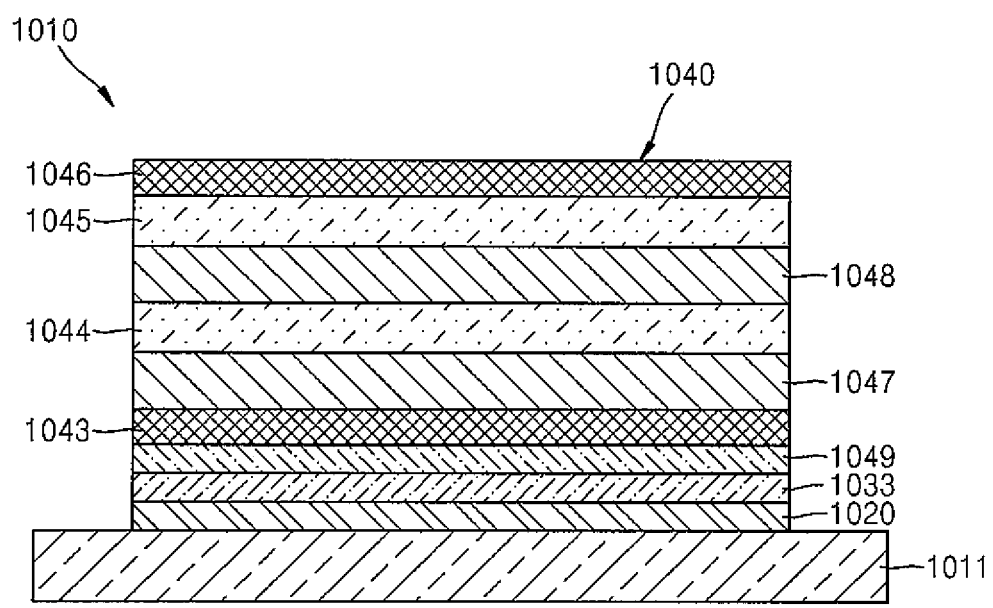

Referring to FIG. 10, in the flexible display panel 1010, a display unit 1020 is formed on a flexible substrate 1011. A capping layer 1033 is formed on the display unit 1020.

A thin-film encapsulating layer 1040 is formed on the display unit 1020 or on the capping layer 1033.

According to the present embodiment, the thin-film encapsulating layer 1040 includes a halogenated metal layer 1049 including lithium fluoride (LiF), a first inorganic layer 1043 including a first aluminum oxide ($AlO_x$), a first organic layer 1047 including a first monomer, a second inorganic layer 1044 including a composite-layer structure of a first silicon nitride/first silicon oxide ($SiN_x/SiO_x$), a second organic layer 1048 including a second monomer, a third inorganic layer 1045 including a composite-layer structure of a second silicon nitride/second silicon oxide ($SiN_x/SiO_x$), and a fourth inorganic layer 1046 including a second aluminum oxide ($AlO_x$), which are sequentially stacked away from the display unit 1020.

When the second inorganic layer 1044 and the third inorganic layer 1045 are evaporated and deposited on the first organic layer 1047 and the second organic layer 1048, respectively, a hydrocarbon gas such as $CH_4$ is added to reaction gases $SiH_4$, $N_2O$, and any one of $NH_3$ and $N_2$, used to form the second inorganic layer 1044 and the third inorganic layer 1045, and the flow rate of $CH_4$ is gradually changed.

Accordingly, at the interface between the first organic layer 1047 and the second inorganic layer 1044 and at the interface between the second organic layer 1048 and the third inorganic layer 1045, carbon content gradually decreases from the first organic layer 1047 to the second inorganic layer 1044 and from the second organic layer 1048 to the third inorganic layer 1045, respectively.

According to the one or more of the embodiments of the present invention described above, the thin-film encapsulating layer has a structure in which carbon content gradually varies at the interface between the inorganic layer and the organic layer, thus reducing the difference in composition at the interface between the inorganic layer and the organic layer of the flexible display apparatus, preventing stress concentration and reducing cracking and peeling. As a result, the flexibility of the flexible display apparatus may increase.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:
1. A flexible display apparatus comprising:
a flexible substrate;
a display unit on the flexible substrate; and
a thin-film encapsulating layer on the display unit, the thin-film encapsulating layer comprising at least one organic layer and at least one inorganic layer, between which an interface is defined, the interface comprising carbon having a concentration gradient,
wherein the concentration gradient gradually decreases from about 70% by weight of carbon in the at least one organic layer to about 15% by weight of carbon in the at least one inorganic layer.

2. The flexible display apparatus of claim 1, wherein a gradient of a Young's modulus is inversely proportional to the concentration gradient of the carbon.

3. The flexible display apparatus of claim 1, wherein the at least one inorganic layer comprises a material selected from the group consisting of silicon oxynitride ($SiO_xN_y$), silicon oxide ($SiO_x$), silicon nitride ($SiN_x$), aluminum oxide ($AlO_x$), silicon carbide ($SiC_x$) and combinations thereof.

4. The flexible display apparatus of claim 3, wherein the at least one inorganic layer is formed by applying a hydrocarbon gas to a plurality of reaction gases for forming the at least one inorganic layer, and gradually changing a flow rate of the hydrocarbon gas.

5. The flexible display apparatus of claim 4, wherein the at least one inorganic layer comprises a silicon oxynitride ($SiO_xN_y$) layer,
the plurality of reaction gases for forming the $SiO_xN_y$ layer comprises silane ($SiH_4$), nitrogen oxide ($N_2O$), and at least one of ammonia ($NH_3$) or nitrogen gas ($N_2$),
the hydrocarbon gas comprises methane ($CH_4$), and
the carbon having a concentration gradient is distributed at the interface between the at least one organic layer and the at least one inorganic layer by gradually changing the flow rate of the hydrocarbon gas.

6. The flexible display apparatus of claim 4, wherein the at least one inorganic layer comprises a silicon oxide ($SiO_x$) layer,
the plurality of reaction gases for forming the $SiO_x$ layer comprises silane ($SiH_4$) and nitrogen oxide ($N_2O$),
the hydrocarbon gas comprises methane ($CH_4$), and
the carbon having a concentration gradient is distributed at the interface between the at least one organic layer and the at least one inorganic layer by gradually changing the flow rate of the hydrocarbon gas.

7. The flexible display apparatus of claim 4, wherein the at least one inorganic layer comprises a silicon nitride ($SiN_x$) layer,
the plurality of reaction gases for forming the $SiN_x$ layer comprises silane ($SiH_4$) and at least one of ammonia ($NH_3$) or nitrogen gas ($N_2$),
the hydrocarbon gas comprises methane ($CH_4$), and
the carbon having a concentration gradient is distributed at the interface between the at least one organic layer and the at least one inorganic layer by gradually changing the flow rate of the hydrocarbon gas.

8. The flexible display apparatus of claim 4, wherein the at least one inorganic layer comprises a composite layer selected from silicon oxide/silicon nitride ($SiO_x/SiN_x$) or silicon nitride/silicon oxide ($SiN_x/SiO_x$),
the plurality of reaction gases for forming the composite layer comprises silane ($SiH_4$), nitrogen oxide ($N_2O$), and at least one of ammonia ($NH_3$) or nitrogen gas ($N_2$),
the hydrocarbon gas comprises methane ($CH_4$), and
the carbon having a concentration gradient is distributed at the interface between the at least one organic layer and the at least one inorganic layer by gradually changing the flow rate of the hydrocarbon gas.

9. The flexible display apparatus of claim 3, wherein the thin-film encapsulating layer comprises a lithium fluoride (LiF) layer, a first aluminum oxide ($AlO_x$) layer, a first organic layer, a first inorganic layer comprising a silicon oxynitride ($SiO_xN_y$) layer, a second organic layer, a second inorganic layer comprising a silicon oxynitride ($SiO_xN_y$)

layer, and a second aluminum oxide ($AlO_x$) layer, sequentially stacked from the display unit.

10. The flexible display apparatus of claim 3, wherein the thin-film encapsulating layer comprises a lithium fluoride (LiF) layer, a first aluminum oxide ($AlO_x$) layer, a first organic layer, a first inorganic layer comprising a silicon oxide ($SiO_x$) layer, a second organic layer, a second inorganic layer comprising a silicon oxide ($SiO_x$) layer, and a second aluminum oxide ($AlO_x$) layer, sequentially stacked from the display unit.

11. The flexible display apparatus of claim 3, wherein the thin-film encapsulating layer comprises a lithium fluoride (LiF) layer, a first aluminum oxide ($AlO_x$) layer, a first organic layer, a first inorganic layer comprising a silicon nitride ($SiN_x$) layer, a second organic layer, a second inorganic layer comprising a silicon nitride ($SiN_x$) layer, and a second aluminum oxide ($AlO_x$) layer, sequentially stacked from the display unit.

12. The flexible display apparatus of claim 3, wherein the thin-film encapsulating layer comprises a lithium fluoride (LiF) layer, a first aluminum oxide ($AlO_x$) layer, a first organic layer, a first inorganic layer comprising a silicon oxide/silicon nitride ($SiO_x/SiN_x$) layer, a second organic layer, a second inorganic layer comprising a silicon oxide/silicon nitride ($SiO_x/SiN_x$) layer, and a second aluminum oxide ($AlO_x$) layer, sequentially stacked from the display unit.

13. The flexible display apparatus of claim 3, wherein the thin-film encapsulating layer comprises a lithium fluoride (LiF) layer, a first aluminum oxide ($AlO_x$) layer, a first organic layer, a first inorganic layer comprising a silicon nitride/silicon oxide ($SiN_x/SiO_x$) layer, a second organic layer, a second inorganic layer comprising a silicon nitride/silicon oxide ($SiN_x/SiO_x$) layer, and a second aluminum oxide ($AlO_x$) layer, sequentially stacked from the display unit.

14. A method of manufacturing a flexible display apparatus, the method comprising:
    positioning a display unit on a flexible substrate and positioning the flexible substrate and the display unit inside a vacuum chamber;
    applying a thin-film encapsulating layer on the display unit by evaporation, the thin-film encapsulating layer comprising at least one organic layer and at least one inorganic layer, between which an interface is defined,
    injecting a plurality of reaction gases into the vacuum chamber while forming the at least one inorganic layer, and
    evaporating the plurality of reaction gases such that the interface between the at least one organic layer and the at least one inorganic layer comprises carbon having a concentration gradient,
    wherein the concentration gradient gradually decreases from about 70% by weight of carbon in the at least one organic layer to about 15% by weight of carbon in the at least one inorganic layer.

15. The method of claim 14, wherein the at least one inorganic layer comprises a material selected from the group consisting of silicon oxynitride ($SiO_xN_y$), silicon oxide ($SiO_x$), silicon nitride ($SiN_x$), aluminum oxide ($AlO_x$), silicon carbide ($SiC_x$) and combinations thereof.

16. The method of claim 15, wherein the at least one inorganic layer is formed by applying a hydrocarbon gas to the plurality of reaction gases and gradually changing at least one of a flow rate of the hydrocarbon gas or a flow rate of the at least one of the plurality of reaction gases.

* * * * *